United States Patent
Fujimura et al.

(10) Patent No.: US 10,721,823 B2
(45) Date of Patent: Jul. 21, 2020

(54) LAMINATE PRODUCTION METHOD

(71) Applicant: ZEON CORPORATION, Tokyo (JP)

(72) Inventors: Makoto Fujimura, Tokyo (JP); Youhei Tateishi, Tokyo (JP)

(73) Assignee: INTEL CORPORATION, Santa Clara, CA (US)

(*) Notice: Subject to any disclaimer, the term of this patent is extended or adjusted under 35 U.S.C. 154(b) by 604 days.

(21) Appl. No.: 15/513,958

(22) PCT Filed: Sep. 29, 2015

(86) PCT No.: PCT/IB2015/002108
§ 371 (c)(1),
(2) Date: Aug. 28, 2017

(87) PCT Pub. No.: WO2016/051277
PCT Pub. Date: Apr. 7, 2016

(65) Prior Publication Data
US 2017/0359908 A1    Dec. 14, 2017

(30) Foreign Application Priority Data

Sep. 29, 2014  (JP) ................. 2014-198099

(51) Int. Cl.
| | |
|---|---|
| H05K 3/42 | (2006.01) |
| H05K 3/00 | (2006.01) |
| H05K 3/46 | (2006.01) |
| H05K 1/11 | (2006.01) |

(52) U.S. Cl.
CPC ............ *H05K 3/429* (2013.01); *H05K 3/005* (2013.01); *H05K 3/007* (2013.01); *H05K 3/0014* (2013.01); *H05K 3/0055* (2013.01); *H05K 3/423* (2013.01); *H05K 3/425* (2013.01); *H05K 3/4644* (2013.01); *H05K 1/115* (2013.01); *H05K 3/0032* (2013.01); *H05K 3/427* (2013.01); *H05K 2203/072* (2013.01); *H05K 2203/0723* (2013.01); *H05K 2203/1105* (2013.01)

(58) Field of Classification Search
CPC ...... H05K 3/429; H05K 3/005; H05K 3/0055; H05K 3/007; H05K 1/115; H05K 2203/072; H05K 2203/0723
See application file for complete search history.

(56) References Cited

U.S. PATENT DOCUMENTS

| | | | | |
|---|---|---|---|---|
| 5,451,721 A | * | 9/1995 | Tsukada ............... | H05K 1/0265 174/261 |
| 5,846,853 A | * | 12/1998 | Otsuki ................. | H01L 21/563 438/119 |
| 5,948,280 A | * | 9/1999 | Namgung ............ | H05K 3/0035 174/255 |
| 6,121,553 A | * | 9/2000 | Shinada ............ | H01L 23/49894 174/255 |
| 6,127,025 A | * | 10/2000 | Bhatt ..................... | H05K 1/113 174/255 |
| 2005/0048408 A1 | * | 3/2005 | Japp ...................... | H05K 3/4641 430/311 |
| 2008/0078570 A1 | * | 4/2008 | Japp ..................... | H01L 23/145 174/256 |
| 2010/0203713 A1 | * | 8/2010 | Ohmi .................. | H01L 21/0331 438/481 |
| 2014/0174804 A1 | * | 6/2014 | Tseng ..................... | H01L 24/19 174/260 |
| 2015/0237736 A1 | * | 8/2015 | Iga ....................... | H05K 3/0014 174/255 |
| 2015/0271917 A1 | * | 9/2015 | Choi ..................... | H05K 3/429 174/251 |
| 2016/0257812 A1 | * | 9/2016 | Fujimura ............. | H05K 1/0353 |
| 2017/0359907 A1 | * | 12/2017 | Fujimura ............. | H05K 3/0014 |
| 2017/0359908 A1 | * | 12/2017 | Fujimura ............. | H05K 3/007 |

FOREIGN PATENT DOCUMENTS

| | | | |
|---|---|---|---|
| CN | 1396800 A | 2/2003 | |
| JP | 59-051594 A | 3/1984 | |
| JP | 06-260759 A | 9/1994 | |
| JP | 2003017834 A | * 1/2003 | ............... H05K 3/18 |
| JP | 2014-007403 A | 1/2014 | |
| KR | 10-2013-0135106 A | 12/2013 | |
| TW | 201414390 A | 4/2014 | |

OTHER PUBLICATIONS

International Preliminary Report on Patentability received for PCT Patent Application No. PCT/IB2015/002108, dated Apr. 13, 2017, 13 pages (7 pages of English Translation and 6 pages of Original Document).
PCT International Search Report for PCT Counterpart Application No. PCT/IB2015/002108 with English translation, 4 pgs. (dated Apr. 19, 2016).
PCT Written Opinion of the International Searching Authority for PCT Counterpart Application No. PCT/IB2015/002108, 4 pgs. (dated Apr. 19, 2016).

* cited by examiner

*Primary Examiner* — Peter Dungba Vo
*Assistant Examiner* — Jeffrey T Carley
(74) *Attorney, Agent, or Firm* — Womble Bond Dickinson (US) LLP

(57) ABSTRACT

Method of manufacturing laminate body by: curing thermosetting resin composition on a support; laminating the curable resin onto a substrate; heating the laminate; forming a via hole in the cured resin layer; peeling the supporting body from the cured composite; performing a second heating of the cured composite; removing resin residue in the via hole of the cured composite; and forming a conductor layer on an inner wall surface of the via hole by electroless plating or a combination of electroless plating and electrolytic plating.

14 Claims, No Drawings

LAMINATE PRODUCTION METHOD

FIELD

The present invention relates to a method of manufacturing a laminate body wherein a conductor layer and a cured resin layer are provided on a substrate.

BACKGROUND

Along with pursuing downsizing, multifunctionalization, increasing communication speeds, and the like of electronic equipment, further densification of the circuit board used in electronic equipment is required, and multilayering of circuit boards is being achieved to meet the requirements of densification. The multilayer circuit board is formed, for example, on an inner layer substrate made of an electrical insulating layer and a conductor layer formed on a surface of the electrical insulating layer, by laminating an electrical insulating layer and forming a conductor layer on the electrical insulating layer, and further repeating laminating the electrical insulating layers and forming the conductor layers.

As a method of manufacturing the laminate body for forming the multilayer circuit board, for example, Patent Document 1 discloses a manufacturing method of a multilayer printed wiring board that requires a step of heating and applying pressure to perform laminating under vacuum conditions, in a condition of directly covering a resin composition layer of an adhesive film onto at least a pattern processed portion of one surface or both surfaces on a supporting base film having a release layer and a circuit board that was pattern processed thereof, a step of thermally curing the resin composition in a condition attached to the supporting base film, a step of hole punching by a laser or drill, a step of peeling the supporting base film, a step of performing roughening treatment to a resin composition surface, and then a step of plating the roughened surface to form a conductor layer.

In the Patent Literature 1, the resin composition is thermally cured in a condition attached to a supporting body such as a supporting base film, and thereby, foreign matter that attaches during thermal curing of the resin composition and defects such as disconnecting, shorting, and the like caused by the foreign matter are prevented. Furthermore, in Patent Literature 1, after the resin composition in the condition attached with the supporting body is thermally cured, and before the supporting body is peeled, a small diameter via hole can be formed by performing hole punching by a laser or drill.

CITATION LIST

Patent Literature

Patent Literature 1: Japanese Unexamined Patent Application Publication No. 2001-196743

SUMMARY

Problem to be Resolved by the Invention

However, with the technique in Patent Document 1, when thermal curing is performed on the resin composition in a condition attached to a supporting body such as a supporting base film, heating is insufficient in the case of peeling the supporting body after thermal curing, and the cured resin after thermal curing may have inferior heat resistance.

The object of the present invention is to provide a method for manufacturing a laminate body with excellent heat resistance (solder heat resistance, for example), in which a small diameter via hole can be formed.

As a result of extensive studies, the inventors discovered that with the method of manufacturing the laminate body provided with the conductor layer and the cured resin layer on the substrate, after the curable resin composition layer in a condition attached to the supporting body is heated and thereby cured, and after the via hole is formed by performing hole punching of the cured resin layer from the supporting body side after curing, and after peeling the supporting body, by adopting a step of performing heating again and removing the resin residue in the via hole that was formed, the problem of heat resistance when the curable resin composition layer in a condition attached to the supporting body is thermally cured can be effectively resolved, and therefore the present invention was achieved.

In other words, the present invention provides:

[1] a manufacturing method of a laminate body, containing: a first step of forming onto a supporting body a curable resin composition layer formed from a thermosetting resin composition to obtain a curable resin composition layer with a supporting body; a second step of laminating the aforementioned curable resin composition layer with a supporting body onto a substrate on a curable resin composition layer forming surface side to obtain a pre-curing composite with a supporting body formed from a substrate and a curable resin composition layer with a supporting body; a third step of performing a first heating of the aforementioned composite and thermally curing the aforementioned curable resin composition layer to form a cured resin layer to obtain a cured composite with a supporting body formed from a substrate and a cured resin layer with a supporting body; a fourth step of performing hole punching from the aforementioned supporting body side of the aforementioned cured composite with a supporting body to form a via hole in the aforementioned cured resin layer; a fifth step of peeling the aforementioned supporting body from the aforementioned cured composite with a supporting body to obtain a cured composite formed from a substrate and a cured resin layer; a sixth step of performing a second heating of the cured composite; a seventh step of removing resin residue in the via hole of the aforementioned cured composite; and an eighth step of forming a conductor layer on an inner wall surface of the via hole of the aforementioned cured composite and on the aforementioned cured resin layer; wherein the forming of the conductor layer in the via hole in step 8 is performed by filling the via hole with a conductor via electroless plating or a combination of electroless plating and electrolytic plating;

[2] the manufacturing method of a laminate body according to [1], wherein the heating temperature of the aforementioned second heating in the aforementioned step 6 is lower than the heating temperature of the aforementioned first heating in the aforementioned step 3;

[3] the manufacturing method of a laminate body according to [1] or [2], wherein the forming the aforementioned conductor layer on the cured resin layer is performed by electroless plating or a combination of electroless plating and electrolytic plating,

[4] a laminate body obtained by the manufacturing method according to any one of [1] to [3], and

[5] a multilayer circuit board comprising the laminate body according to [4].

The manufacturing method of the present invention can provide a laminate body with excellent heat resistance (solder heat resistance, for example), in which a small diameter via hole can be formed, and a multilayer circuit board obtained by using the laminate body.

DETAILED DESCRIPTION

The manufacturing method of a laminate body of the present invention is a method of manufacturing the laminate body wherein a conductor layer and a cured resin layer are provided on a substrate, and provides:

(1) a manufacturing method of a laminate body, containing: a first step of forming onto a supporting body a curable resin composition layer formed from a thermosetting resin composition to obtain a curable resin composition layer with a supporting body;

(2) a second step of laminating the aforementioned curable resin composition layer with a supporting body onto a substrate on a curable resin composition layer forming surface side to obtain a pre-curing composite with a supporting body formed from a substrate and a curable resin composition layer with a supporting body;

(3) a third step of performing a first heating of the aforementioned composite and thermally curing the aforementioned curable resin composition layer to form a cured resin layer to obtain a cured composite with a supporting body formed from a substrate and a cured resin layer with a supporting body;

(4) a fourth step of performing hole punching from the aforementioned supporting body side of the aforementioned cured composite with a supporting body to form a via hole in the aforementioned cured resin layer;

(5) a fifth step of peeling the aforementioned supporting body from the aforementioned cured composite with a supporting body to obtain a cured composite formed from a substrate and a cured resin layer;

(6) a sixth step of performing a second heating of the aforementioned cured composite; and (7) a seventh step of removing resin residue in the via hole of the aforementioned cured composite; and additionally, (8) an eighth step of forming a conductor layer on an inner wall surface of the via hole of the aforementioned cured composite and on the aforementioned cured resin layer.

Additionally, in the manufacturing method of the laminate body of the present invention, the forming of the conductor layer in the aforementioned via hole in the aforementioned step 8 is performed by filling the aforementioned via hole with a conductor by electroless plating or a combination of electroless plating and electrolytic plating.

First Step

The first step of the manufacturing method of the present invention is a step of forming onto a supporting body a curable resin composition layer formed from a thermosetting resin composition to obtain a curable resin composition layer with a supporting body.

The supporting body used in the first step of the manufacturing method of the present invention is not particularly limited, but examples thereof include film members, plate members, or the like, and specific examples include polyethylene terephthalate films, polypropylene films, polyethylene films, polycarbonate films, posiethylene naphthalate films, polyarylate films, nylon films, positetrafluoroethylene films, and other polymer films, plate or film glass substrates, and the like. As the supporting body, in a below-described fifth step, in order to better facilitate peeling from the cured resin layer, the supporting body preferably has a mold release layer provided on the surface through a mold release treatment, and is preferably a polyethylene terephthalate film having a mold release layer.

The thickness of the supporting body used in the first step of the manufacturing method of the present invention is not particularly limited, but is preferably 5 to 200 µm, more preferably 10 to 150 µm, and even more preferably 20 to 60 µm. The thickness of the supporting body used in the first step of the manufacturing method of the present invention is not particularly limited, but is preferably 5 to 200 µm, more preferably 10 to 15 µm, and even more preferably 20 to 60 µm.

Furthermore, the thermosetting resin composition for forming the curable resin composition layer usually contains a curable resin and a curing agent. The curable resin in not particularly limited so long as the curable resin exhibits thermal curability when combined with the curing agent, and has electrical insulating properties, and examples include epoxy resins, maleimide resins, (meth)acrylic resins, diallyl phthalate resins, triazine resins, alicyclic olefin polymers, aromatic polyether polymers, benzocyclobutene polymers, cyanate ester polymer polyimides, and the like. The resins may be used independently or in a combination of two or more types.

A case of using an epoxy resin as the curable resin is described below as an example.

The epoxy resin is not particularly limited, and for example, a polyvalent epoxy compound (A) with a biphenyl structure and/or a condensed polycyclic structure and the like can be used. The polyvalent epoxy compound (A) with a biphenyl structure and/or condensed polycyclic structure (hereinafter may be abbreviated as polyvalent epoxy compound (A)) is a compound having at least one biphenyl structure or condensed polycyclic structure, and having at least two epoxy groups (oxirane ring) in one molecule.

The biphenyl structure refers to a structure wherein two benzene rings are joined by a single bond. The biphenyl structure in the obtained cured resin usually constitutes the main chain in the resin, but can be present in a side chain.

Furthermore, the condensed polycyclic structure refers to a structure formed by condensation of two or more single rings. The ring that configures the condensed polycyclic structure may be alicyclic or aromatic, and may contain a hetero atom. The number of condensed rings is not particularly limited, but is preferably 2 rings or more, and practically, the upper limit is approximately 10 rings from the perspective of increasing heat resistance and mechanical strength of the obtained cured resin layer. Examples of the condensed polycyclic structure include dicyclopentadiene structures, naphthalene structures, fluorene structures, anthracene structures, phenanthrene structures, todiphenylene structures, pyrene structures, ovalene structures, and the like. The polyvalent epoxy compound (A) used in the present invention has a biphenyl structure, condensed polycyclic structure, or both biphenyl structure and condensed polycyclic structure, but from the perspective of increasing heat resistance and mechanical strength of the obtained cured resin layer, the polyvalent epoxy compound (A) preferably has a biphenyl structure, and more preferably has a biphenyl aralkyl structure.

Furthermore, if a polyvalent epoxy compound (A) with a biphenyl structure (including polyvalent epoxy compounds having both a biphenyl structure and a condensed polycyclic structure) and a polyvalent epoxy compound (A) with a condensed polycyclic structure are used in combination as the polyvalent epoxy compound (A), from the perspective of improving heat resistance and electrical properties of the cured resin layer, the compounding ratio thereof is preferably a weight ratio (polyvalent epoxy compound having a biphenyl structure/polyvalent epoxy compound having a condensed polycyclic structure) of usually 3/7 to 7/3.

The polyvalent epoxy compound (A) used in the present invention has at least two epoxy groups in one molecule, and the structure thereof is not limited as long as the compound has a biphenyl structure and/or a condensed polycyclic structure, but from the perspective of the cured resin layer having excellent heat resistance and mechanical strength, the compound is preferably a novolac epoxy compound having a biphenyl structure and/or a condensed polycyclic structure. Examples of the novolac epoxy compound include phenol novolac epoxy compounds, cresol novolac epoxy compounds, and the like.

In order to achieve good curing reactivity, the polyvalent epoxy compound (A) usually has an epoxy equivalent of 100 to 1500 equivalents, and preferably 150 to 500 equivalents. Note that "epoxy equivalent" in the present specification is the number of grams (g/eq) of the epoxy compound containing 1 gram equivalent of an epoxy group, which can be measured according to a method of JIS K 7236.

The polyvalent epoxy compound (A) used in the present invention can be appropriately manufactured according to a known method, and can also be obtained as a commercially available product.

Examples of commercially available products of the polyvalent epoxy compound (A) having a biphenyl structure include novolac epoxy compounds having a biphenyl aralkyl structure such as trade name "NC3000-FH, NC3000-H, NC3000, NC3000-L, NC3100" (manufactured by Nippon Kayaku Co., Ltd.); epoxy compounds having a tetramethylbiphenyl structure such as trade name "YX-4000" (manufactured by Mitsubishi Chemical Corporation); and the like.

Furthermore, examples of the commercially available product of the polyvalent epoxy compound having a condensed polycyclic structure include novolac epoxy compounds having a dicyclopentadiene structure, such as trade name "Epiclon HP7200L, Epiclon HP7200, Epiclon HP7200H, Epiclon HP7200HH, Epiclon HP7200HHH" ("Epiclon" is a registered trademark, manufactured by DIC Corporation), trade name "Tactix 556, Tactix 756" ("Tactix" is a registered trademark, manufactured by Huntsman Advanced Materials), trade name "XD-1000-1L, XD-1000-2L" (manufactured by Nippon Kayaku Co., Ltd.), and the like.

The polyvalent epoxy compounds (A) can be used independently or in a combination of two or more types.

Furthermore, when using the polyvalent epoxy compound (A) having a biphenyl structure and/or a condensed polycyclic structure, an epoxy compound (B) containing a trivalent or higher polyvalent glycidyl group other than the aforementioned phenol novolac epoxy compound may be used in a combination, and by further using the epoxy compound (B) containing a trivalent or higher polyvalent glycidyl group, heat resistance or electrical properties of the obtained cured resin layer can be further improved.

The epoxy compound (B) containing a trivalent or higher polyvalent glycidyl group other than the phenol novolac epoxy compound is preferably a compound with an epoxy equivalent of 250 or less, and more preferably a compound with 220 or less, from the perspective of heat resistance and electrical properties of the obtained cured resin layer. Specific examples include: polyvalent phenol epoxy compounds having a structure where a hydroxyl group of the trivalent or higher polyvalent phenol is glycidylated, glycidyl amine epoxy compounds where an amino group of a compound containing a divalent or higher polyvalent aminophenyl group is glycidylated, compounds containing a polyvalent glycidyl group where a trivalent or higher compound having the phenol structure or aminophenyl structure in the same molecule is glycidylated, and the like.

The polyvalent phenol epoxy compound having a structure where a hydroxyl group of the trivalent or higher polyvalent phenol is glycidylated is not particularly limited, but is preferably a trivalent or higher polyvalent hydroxyphenylalkane epoxy compound. Here, the trivalent or higher polyvalent hydroxyphenylalkane epoxy compound is a compound having a structure where a hydroxyl group of an aliphatic hydrocarbon substituted with three or more hydroxyphenyl groups.

The epoxy compound (B) containing a trivalent or higher polyvalent glycidyl group used in the present invention can be appropriately manufactured according to a known method, and can also be obtained as a commercially available product.

Examples of commercially available products of the trishydroxyphenylmethane epoxy compound include trade name "EPPN-503, EPPN-502H, EPPN-501H" (manufactured by Nippon Kayaku Co., Ltd.), trade name "TACTIX-742" (manufactured by The Dow Chemical Company), "JER1032H60" (manufactured by Mitsubishi Chemical Corporation), and the like. Furthermore, examples of commercially available products of the tetrakis hydroxyphenylethane epoxy compound include trade name "1031S" (manufactured by Mitsubishi Chemical Corporation), and the like. Examples of the glycidyl amine epoxy compound include trade name "YH-434, YH-434L" (manufactured by Nippon Steel & Sumikin Chemical Co., Ltd.) as a tetravalent glycidyl amine epoxy compound, trade name "jER604" (manufactured by Mitsubishi Chemical Corporation), and the like. Examples of the compound containing a polyvalent glycidyl group where a trivalent or higher compound having a phenol structure or aminophenyl structure in the same molecule is glycidylated include trade name "jER630" (manufactured by Mitsubishi Chemical Corporation) as a trivalent glycidyl amine epoxy compound, or the like.

In the case where the epoxy compound (B) containing a trivalent or higher polyvalent glycidyl group is used in a combination, the content ratio of the epoxy compound (B) containing a trivalent or higher polyvalent glycidyl group is not particularly limited, but is preferably 0.1 to 40 wt. %, more preferably 1 to 30 wt. %, and particularly preferably 3 to 25 wt. % with regard to a total of 100 wt. % of the epoxy compound that is used. By setting the amount of the epoxy compound (B) containing a trivalent or higher polyvalent glycidyl group in the thermosetting resin composition to the aforementioned range in relation to the aforementioned polyvalent epoxy compound (A), the obtained cured resin layer can have further increased heat resistance, electrical properties, and adhesion to the conductor layer.

Furthermore, in addition to the polyvalent epoxy compound (A) and epoxy compound (B) containing a trivalent or higher polyvalent glycidyl group, the thermosetting resin composition used in the present invention can appropriately contain additional epoxy compounds other than the aforementioned epoxy compounds. Examples of additional epoxy compounds include epoxy compounds containing phosphorus. Examples of epoxy compounds containing phosphorus preferably include epoxy compounds having a phosphaphenanthrene structure. By further using an epoxy compound having a phosphaphenanthrene structure, the obtained cured resin layer can have further improved heat resistance, electrical properties, and adhesion to the conductor layer.

It is sufficient that the epoxy compound having a phosphaphenanthrene structure has at least one epoxy group in the molecule. However, from the perspectives of improving crosslinking density, ensuring mechanical strength and heat resistance, and lowering the coefficient of linear expansion and, in turn, enabling improvement of the electrical properties of the obtained cured resin layer, it is preferable that the epoxy compound having a phosphaphenanthrene structure be a polyvalent epoxy compound having at least 2 epoxy groups in the molecule.

In the case where other epoxy compounds having a phosphaphenanthrene structure is contained in the thermosetting resin composition used in the present invention, the content ratio of the epoxy compound having a phosphaphenanthrene structure is not particularly limited, but is preferably 20 to 90 wt. %, and more preferably 30 to 70 wt. % with regard to a total of 100 wt. % of the epoxy compound contained in the thermosetting resin composition.

Note that as the other epoxy compounds thereof, other than the epoxy compound having a phosphaphenanthrene structure, or in addition thereto, alicyclic epoxy compounds, cresol novolac type epoxy compounds, phenol novolac type epoxy compounds, bisphenol A novolac type epoxy compounds, trisphenol type epoxy compounds, tetrakis (hydroxyphenyl)ethane type epoxy compounds, aliphatic chain epoxy compounds, and the like may be used, and these may be procured, as appropriate, as commercially available products.

Furthermore, the thermosetting resin composition used in the present invention may contain a phenol resin (C) containing a triazine structure. The phenol resin (C) containing a triazine structure is a condensation polymer of aromatic hydroxy compounds such as phenol, cresol, naphthol, and the like, compounds having a triazine ring such as melamine, benzenguanamine, and the like, and formaldehyde. The phenol resin (C) containing a triazine structure typically has a structure as expressed by the following general formula (1).

[Formula 1]

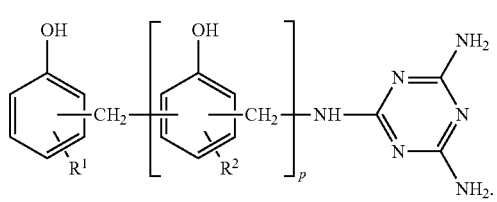

(1)

(In formula (1), $R^1$ and $R^2$ are a hydrogen atom or a methyl group, and p is an integer of 1 to 30. Furthermore, $R^1$ and $R^2$ may be the same or different from each other, and furthermore, when p is 2 or higher, a plurality of $R^2$ may be the same or different from each other. Furthermore, in formula (1), in at least one of the amino groups, a hydrogen atom contained in the amino group can be substituted with another group (an alkyl group or the like, for example).)

The phenol resin (C) containing a triazine structure acts as a curing agent of the epoxy compound by the presence of a phenolic active hydroxy group, and particularly, the obtained cured resin layer exhibits excellent adhesion to the substrate by containing the phenol resin (C) containing a triazine structure.

The phenol resin (C) containing a triazine structure can be manufactured according to a known method, and can also be obtained as a commercially available product. Examples of the commercially available product include trade name "LA70 5 2, LA7054, LA3018, LAI356" (manufactured by DIC Corporation) or the like.

The phenol resin (C) containing a triazine structure can be used independently or in a combination of two or more types.

The added amount of the phenol resin (C) containing a triazine structure in the thermosetting resin composition used in the present invention is in a range of preferably 1 to 60 parts by weight, more preferably 2 to 50 parts by weight, even more preferably 3 to 40 parts by weight, and particularly preferably 4 to 20 parts by weight with regard to a total of 100 parts by weight of the epoxy compound that is used.

Furthermore, the equivalent ratio of the epoxy compound that is used and the phenol resin (C) containing a triazine structure in the thermosetting resin composition used in the present invention (ratio of the total number of active hydroxyl group content in the phenol resin (C) containing a triazine structure, with regard to the total number of epoxy groups of the epoxy compound that is used (active hydroxyl group content/epoxy group content)) is within a range of preferably 0.01 to 0.6, more preferably 0.05 to 0.4, and even more preferably 0.1 to 0.3. By configuring the added amount of the phenol resin (C) containing a triazine structure to the range described above, the electrical properties and heat resistance of the obtained cured resin layer can be improved further. The equivalent ratio of the epoxy compound that is used and the phenol resin (C) containing a triazine structure can be calculated from the total epoxy equivalent of the epoxy compound that is used and the total active hydroxyl equivalent of the phenol resin (C) containing a triazine structure.

Additionally, the thermosetting resin composition used in the present invention preferably contains an active ester compound (D) in addition to the components described above. It is sufficient that the active ester compound (D) contains an active ester group. However, in the present invention, it is preferable that the active ester compound (D) contains at least two active ester groups in the molecule. The active ester compound (D) acts as a curing agent of the epoxy compound used in the present invention, similarly to the phenol resin (C) containing a triazine structure, by an ester site and an epoxy group reacting by heating.

From the perspective of increasing the heat resistance of the obtained cured resin layer, the active ester compound (D), is preferably an active ester compound obtained by reacting a carboxylic acid compound and/or thiocarboxylic acid compound with a hydroxy compound and/or thiol compound, more preferably an active ester compound obtained by reacting one or two types or more selected from a group of carboxylic acid compounds, phenol compounds, naphthol compounds, and thiol compounds, and particularly preferably an aromatic compound obtained by reacting a carboxylic acid compound with an aromatic compound having a phenolic hydroxyl group, and having at least two active ester groups in a molecule. The active ester compound (D) may have a straight chain or multi-branched shape, and in the case where the active ester compound (D) is derived from a compound having at least two carboxylic acids in a molecule, as an example, if the compound having at least two carboxylic acids in a molecule contains an aliphatic chain, compatibility with an epoxy compound can be increased, and if the compound contains an aromatic ring, the heat resistance will be increased.

Specific examples of the carboxylic acid compound for forming the active ester compound (D) include benzoic acids, acetic acids, succinic acids, maleic acids, itaconic acids, phthalic acids, isophthalic acids, terephthalic acids, pyromellitic acids, and the like. Of these, from the perspective of increasing the heat resistance of the obtained cured resin layer, the carboxylic acid compound is preferably a succinic acid, maleic acid, itaconic acid, phthalic acid, isophthalic acid, or terephthalic acid, more preferably a phthalic acid, isophthalic acid, and diphthalic acid, and even more preferably an isophthalic acid, and terephthalic acid.

Specific examples of the thiocarboxylic acid compound for forming the active ester compound (D) include thioacetic acids, thiobenzoic acids, and the like.

Specific examples of the hydroxy compound for forming the active ester compound (D) include hydroquinone, resorcin, bisphenol A, bisphenol F, bisphenol S, phenophtharin, methylated bisphenol A, methylated bisphenol F, methylated bisphenol S, phenol, o-cresol, m-cresol, p-cresol, catechol, α-naphthol, β-naphthol, 1,5-dihydroxynaphthalene, 1,6-dihydroxynaphthalene, 2,6-dihydroxynaphthalene, dihydroxybenzophenone, trihydroxybenzophenone, tetrahydroxybenzophenone, phloroglucin, benzene triol, dicyclopentadienyl diphenol, phenol novolac, and the like. Of these, from the perspective of improving solubility of the active ester compound (D) as well as increasing the heat resistance of the obtained cured resin layer, the hydroxy compound is preferably 1,5-dihydroxynaphthalene, 1,6-dihydroxynaphthalene, 2,6-dihydroxynaphthalene, dihydroxybenzophenone, trihydroxybenzophenone, tetrahydroxybenzophenone, dicyclopentadienyl diphenol, and phenol novolac, more preferably dihydroxybenzophenone, trihydroxybenzophenone, tetrahydro, roxybensophenone, dicyclopentadienyl diphenol, and phenol novolac, and even more preferably dicyclopentadienyl diphenol, and phenol novolac.

Specific examples of the thiol compound for forming the active ester compound (D) include benzenedithiol, todiazindithiol, and the like.

The manufacturing method of the active ester compound (D) is not particularly limited, and the compound can be manufactured by a known method. For example, the compound can be obtained by condensation reaction of the aforementioned carboxylic acid compound and/or thiocarboxylic acid compound with a hydroxy compound and/or thiol compound.

For example, an aromatic compound having an active ester group disclosed in Japanese Unexamined Patent Application No. 2002-12650, a polyfunctional polyester disclosed in Japanese Unexamined Patent Application No. 2004-277460, and commercially available products can be used as the active ester compound (D). Examples of the commercially available products include trade name "EXB 9451, EXB 9460, EXB 9460S, Epiclon HPC-8000-65T" ("Epicion" is a registered trademark, manufactured by DIC Corporation), trade name "DC 808" (manufactured by Japan Epoxy Resins Co., Ltd.), trade name "YLH 1026" (manufactured by Japan Epoxy Resin Co., Ltd.) and the like.

The added amount of the active ester compound (D) in the thermosetting resin composition used in the present invention is in a range of preferably 10 to 150 parts by weight, more preferably 15 to 130 parts by weight, and even more preferably 20 to 120 parts by weight with regard to a total of 100 parts by weight of the epoxy compound that is used.

Furthermore, the equivalent ratio of the epoxy compound that is used and the active ester compound (D) in the thermosetting resin composition used in the present invention (ratio of the total number of reactive groups of the active ester compound (D), with regard to the total number of epoxy groups of the epoxy compound that is used (active ester group content/epoxy group content)) is within a range of preferably 0.5 to 1.2, more preferably 0.6 to 0.9, and even more preferably 0.65 to 0.85.

Furthermore, the equivalent ratio of the epoxy compound that is used, the phenol resin (C) containing a triazine structure, and the active ester compound (D) in the thermosetting resin composition used in the present invention {ratio of the total number of epoxy groups in the epoxy compound that is used, with regard to the active hydroxyl group of the phenol resin (C) containing a triazine structure and the active ester group of the active ester compound (D) (epoxy group content/(active hydroxyl group content+active ester group content)} is within a range of usually less than 1.2, preferably 0.6 to 0.99, and more preferably 0.65 to 0.95. By setting the equivalent ratio to the aforementioned range, the obtained cured resin layer can exhibit good electric properties. Note that the equivalent ratio of the epoxy compound that is used, and the phenol resin (C) containing a triazine structure and the active ester compound (D) can be determined from the total epoxy equivalent of the epoxy compound that is used, and the total active hydroxyl group equivalent of the phenol resin (C) containing a triazine structure and the total active ester equivalent of the active ester compound (D).

In addition to the aforementioned components, the thermosetting resin composition used in the present invention can further contain other components as described below.

The linear expansion of the obtained cured resin layer can be lowered by adding a filler to the thermosetting resin composition. Any known inorganic filler or organic filler can be used as the filler, but an inorganic filler is preferable. Specific examples of the inorganic filler include calcium carbonate, magnesium carbonate, barium carbonate, zinc oxide, titanium oxide, titania oxide, magnesium silicate, calcium silicate, zirconium silicate, hydrated aluminas, magnesium hydroxide, aluminum hydroxide, barium sulfate, silica, talc, clay, and the like. Note that the filler that is used can be previously surface treated with a silane coupling agent or the like. The amount of filler in the thermosetting resin composition used in the present invention is not particularly limited, but is usually 30 to 90 wt. % in terms of solid content.

Furthermore, an alicyclic olefin polymer having a polar group can be added to the thermosetting resin composition. Examples of the polar group include groups having a structure that can react with an epoxy group and form a covalent bond, and groups containing a hetero atom and having no reactivity with epoxy groups, but preferably the groups contain a hetero atom and have no reactivity with epoxy groups. The alicyclic olefin polymer has no reactivity with epoxy groups, and therefore, does not substantially contain a functional group having reactivity with epoxy groups. Herein, "does not substantially contain a functional group having reactivity with epoxy groups" means that the alicyclic olefin polymer does not contain a functional group having reactivity with epoxy groups to a degree of inhibiting the expression of the effect of the present invention. Examples of the functional group having reactivity with epoxy groups include groups having a structure that can react with an epoxy group and form a covalent bond, and examples thereof include primary amino groups, secondary amino groups, mercapto groups, carboxyl groups, carboxylic acid anhydride groups, hydroxy groups, epoxy groups, and other functional groups containing a hetero atom that reacts with an epoxy group to form a covalent bond.

The aforementioned alicyclic olefin polymer can be easily obtained by appropriately combining, for example, an alicyclic olefin monomer (a) containing no hetero atoms and containing an aromatic ring, alicyclic olefin monomer (b) containing no aromatic rings and containing a hetero atom, alicyclic olefin monomer (c) containing both an aromatic ring and a hetero atom, and a monomer (d) containing neither aromatic rings nor hetero atoms, and that can polymerize the alicyclic olefin monomers (a) to (c), and polymerizing according to a known method. The obtained polymer may be further hydrogenated.

The added amount of the alicyclic olefin polymer having a polar group in the thermosetting resin composition used in the present invention is not particularly limited is usually 50 parts by weight or less, and is preferably 35 parts by weight or less with regard to a total of 100 parts by weight of the epoxy compound that is used.

The thermosetting resin composition may optionally contain a curing promoting agent. The curing promoting agent is not particularly limited, but examples thereof include aliphatic polyamines, aromatic polyamines, secondary amines, tertiary amines, acid anhydrides, imidazole derivatives, organic acid hydrazides, dicyandiamides, derivatives thereof, urea derivatives, and the like. Of these, imidazole derivatives are particularly preferable.

The imidazole derivatives are not particularly limited, and examples thereof include alkyl-substituted imidazole compounds such as 2-ethylimidazole, 2-ethyl-4-methylimidazole, bis-2-ethyl-4-methylimidazole, 1-methyl-2-ethylimidazole, 2-isopropyl imidazole, 2,4-dimethylimidazole, and 2-heptadecylimidazole; imidazole compounds substituted with a hydrocarbon group containing a cyclic structure such as an aryl group or an aralkyl group such as 2-phenylimidazole, 2-phenyl-4-methylimidazole, 1-benzyl-2-methylimidazole, 1-benzyl-2-ethylimidazole, 1-benzyl-2-phenylimidazole, pentimidazole, and 2-ethyl-4-methyl-1-(2'-cyanoethyl) imidazole; and the like. These may be used independently as one type or may be used in a combination of two or more types.

The added amount of the curing promoting agent in the thermosetting resin composition used in the present invention is usually from 0.1 to 10 parts by weight and is preferably from 0.5 to 8 parts by weight with regard to a total of 100 parts by weight of the epoxy compound that is used.

Furthermore, for the purpose of improving flame retardancy of the obtained cured resin layer, a flame retardant that is added to a general resin composition for forming an electrical insulating film such as a halogen type flame retardant or a phosphate ester type flame retardant, for example, may be appropriately added to the thermosetting resin composition.

Furthermore, if desired, flame retardant auxiliary agents, heat resistant stabilizers, weather resistant stabilizers, antioxidants, ultraviolet absorbers (laser processability improvers), leveling agents, antistatic agents, slip agents, anti-blocking agents, anti-fogging agents, lubricants, dyes, natural oils, synthetic oils, waxes, emulsions, magnetic materials, dielectric property adjusting agents, toughening agents, and other known components may be appropriately added to the thermosetting resin composition of the present invention.

The method of preparing the thermosetting resin composition used in the present invention is not particularly limited, and the aforementioned components may be mixed as they are, or may be mixed in a state dissolved or dispersed in an organic solvent. Alternatively, a composition in a state wherein a portion of the components are dissolved or dispersed in an organic solvent may be prepared, and then the remaining components may be mixed into the composition.

In the first step of the manufacturing method of the present invention, the thermosetting resin composition described above can be used to form the curable resin composition layer, made of the thermosetting resin composition, on the supporting body to obtain the curable resin composition layer with a supporting body.

The method for forming the curable resin composition layer, made from the thermosetting resin composition, on the supporting body is not particularly limited, but a method of adding an organic solvent to the thermosetting resin composition as desired, and then coating, spraying, or casting the composition onto the supporting body, and then drying, is preferable.

The thickness of the curable resin composition layer is not particularly limited, but from the perspective of workability and the like, the thickness is usually 5 to 50 µm, preferably 7 to 40 µm, more preferably 10 to 35 µm, and even more preferably 10 to 30 µm.

Examples of the method of coating the thermosetting resin composition include dip coating, roll coating, curtain coating, die coating, slit coating, gravure coating, and the like.

Note that the thermosetting resin composition from which the curable resin composition layer is made may be in an uncured or semi-cured state. Herein, "uncured" refers to a state where substantially all of the curable resin dissolves when the curable resin composition layer is immersed in a solvent that can dissolve the curable resin (epoxy resin, for example) that is used for preparing the thermosetting resin composition. Furthermore, "semi-cured" refers to a state in which the composition is partially cured and can be further cured by performing further heating; and preferably refers to a state in which a portion (specifically an amount of 7 wt. % or greater with a portion remaining) of the curable resin dissolves in a solvent that can dissolve the curable resin used for preparing the thermosetting resin composition, or a state where the volume after immersing the molded body in the solvent for 24 hours is 200% or greater than the volume before immersing (swelling ratio).

Furthermore, after the thermosetting resin composition is coated onto the supporting body, drying may be performed if desired. The drying temperature is preferably a temperature at which the thermosetting resin composition is not cured, and may be set according to the type of curable resin that is used, but is usually 20 to 300° C., and preferably 30 to 200° C. If the drying temperature is too high, the curing reaction advances excessively and there is a risk where the obtained curable resin composition layer may not be in an uncured or semi-cured state. Additionally, drying time is usually set to 30 seconds to 1 hour and is preferably set to 1 minute to 30 minutes.

Furthermore, in the first step of the manufacturing method of the present invention, a structure may be formed including two or more of the curable resin composition layer. For example, a configuration is possible in which, before forming the resin layer (hereinafter, the resin layer is referred to as "the first resin layer") formed by using the aforementioned thermosetting resin composition (hereinafter, the thermosetting resin composition is referred to as "the first thermosetting resin composition"), a second thermosetting resin composition which is different from the first thermosetting resin composition is used to form a second resin layer, different from the first resin layer, on the supporting body and then the first resin layer is formed on the second resin layer using the first thermosetting resin composition. Thus, the curable resin composition layer can be configured with a two layer structure. In this case, for example, the second resin layer may be used as a plating target layer on which a conductor layer is formed by electroless plating or the like, and the first resin layer may be used as an adhesive layer for bonding to a substrate.

The second thermosetting resin composition for forming the second resin layer is not particularly limited, and usually, a composition containing a curable resin which is different from the first thermosetting resin composition and a curing gent can be used, but from the perspective of improving electrical properties and heat resistance of the curable resin composition layer, the curable resin preferably contains an alicyclic olefin polymer having a polar group.

The alicyclic olefin polymer having a polar group is not particularly limited, and examples of the alicyclic structure include cycloalkane structures, cycloalkene structures, and the like. From the perspective of obtaining excellent mechanical strength, heat resistance, and the like, alicyclic olefin polymers having a polar group that include cycloalkane structures are preferable. Furthermore, examples of the polar group contained in the alicyclic olefin polymer include alcoholic hydroxyl groups, phenolic hydroxyl groups, carboxyl groups, alkoxyl groups, epoxy groups, glycidyl groups, oxycarbonyl groups, carbonyl groups, amino groups, carboxylic acid anhydride groups, sulfonic acid groups, phosphoric acid groups, and the like. Of these, carboxyl groups, carboxylic acid anhydride groups, and phenolic hydroxyl groups are preferable, and carboxylic acid anhydride groups are more preferable.

Furthermore, the curing agent contained in the second thermosetting resin composition is not particularly limited as long as the curing agent can form a crosslinked structure with the alicyclic olefin polymer having a polar group by heating, and a curing agent that is added to general resin compositions for forming electrical insulating films can be used. The curing agent is preferably a compound having two or more functional groups that can form a bond by reacting with the polar group of the alicyclic olefin polymer having a polar group that is used.

For example, examples of the curing agent preferably used in cases where an alicyclic olefin polymer having a carboxyl group, a carboxylic acid anhydride group, or a phenolic hydroxyl group is used as the alicyclic olefin polymer having a polar group, include polyvalent epoxy compounds, polyvalent isocyanate compounds, polyvalent amine compounds, polyvalent hydrazide compounds, aziridine compounds, basic metal oxides, organometallic halides, and the like. One type thereof may be used independently, or two or more types thereof may be used in combination. Furthermore, the compounds can be used in combination with peroxides to use as a curing agent. Of these, from the perspective of having gentle reactivity with the polar group of the alicyclic olefin polymer having a polar group, and because handling of the second thermosetting resin composition will be easier, the curing agent is preferably a polyvalent epoxy compound, and particularly preferably a glycidyl ether type epoxy compound or alicyclic polyvalent epoxy compound.

The added amount of the curing agent in the second thermosetting resin composition is preferably within a range of 1 to 100 parts by weight, more preferably 5 to 80 parts by weight, and even more preferably 10 to 50 parts by weight with regard to 100 parts by weight of the alicyclic olefin polymer having a polar group. By setting the added amount of the curing agent to the aforementioned range, favorable mechanical strength and electrical properties of the cured resin layer can be obtained.

Moreover, in addition to the abovementioned components, the second thermosetting resin composition may contain a hindered phenol compound and a hindered amine compound.

The content amount of the hindered phenol compound in the second thermosetting resin composition is not particularly limited, but is preferably in a range of from 0.04 to 10 parts by weight, and more preferably in a range of from 0.3 to 5 parts by weight, and even more preferably in a range of from 0.5 to 3 parts by weight per 100 parts by weight of the alicyclic olefin polymer having a polar group. By setting the added amount of the hindered phenol compound to the aforementioned range, the mechanical strength of the cured resin layer can be made favorable.

Furthermore, the hindered amine compound is a compound having at least one 2,2,6,6-tetra alkyl piperidine group having a secondary amine or a tertiary amine at the 4-position per molecule. The number of carbons of the alkyl is ordinarily from 1 to 50. The hindered amine compound is preferably a compound having at least one 2,2,6,6-tetra methyl piperidyl group with a secondary amine or a tertiary amine at the 4-position per molecule. Note that with the present invention, a hindered phenol compound and a hindered amine are preferably used in combination, and by using these in combination, an aqueous solution of permanganate or the like is used with regard to the cured resin layer, and if a surface roughening treatment is performed, even if the surface roughening treatment conditions are changed, the cured article after the surface roughening treatment can be maintained as an article with a low level of surface roughness.

The blending amount of the hindered amine compound is not particularly limited, but ordinarily is from 0.02 to 10 parts by weight, preferably from 0.2 to 5 parts by weight, and more preferably from 0.25 to 3 parts by weight per 100 parts by weight of the alicyclic olefin polymer having a polar group. By setting the blending amount of the hindered amine compound to be within the abovementioned range, the mechanical strength of the cured resin layer can be made favorable.

Moreover, in addition to the abovementioned components, the second thermosetting resin composition may contain a curing accelerator. As the curing accelerator, a curing accelerator ordinarily blended in resin compositions for the formation of electrical insulation films may be used, and for example, the same curing accelerator as that of the first thermosetting resin composition can be used. The blending amount of the curing accelerator in the second thermosetting resin composition can be selected, as appropriate, according to the usage purpose, but is preferably from 0.001 to 30 parts by weight, more preferably from 0.01 to 10 parts by weight, and even more preferably from 0.03 to 5 parts by weight per 100 parts by weight of the alicyclic olefin polymer having a polar group.

Furthermore, in addition to the abovementioned components, the second thermosetting resin composition may contain a filler. As the filler, the same fillers as those used in the first thermosetting resin composition can be used. The blending amount of the filler in the second thermosetting resin composition is, in terms of solid content, ordinarily from 1 to 50 wt %, preferably from 2 to 45 wt %, and more preferably from 3 to 35 wt %.

Furthermore, similar to the first thermosetting resin composition, in addition to the abovementioned components, the second thermosetting resin composition may be further blended, as appropriate, with curing accelerators, flame retardants, flame retardant auxiliary agents, heat resistant stabilizers, weather resistant stabilizers, anti-aging agents, ultraviolet absorbers (laser processability improvers), leveling agents, antistatic agents, slip agents, anti-blocking agents, anti-fogging agents, lubricants, dyes, natural oils, synthetic oils, waxes, emulsions, magnetic materials, dielectric property adjusting agents, toughening agents, and other known components.

The method for producing the second thermosetting resin composition is not particularly limited, and each of the abovementioned components may be mixed as is, or may be mixed in a state of being dissolved or dispersed in an organic solvent, or a composition may be prepared in a state in which some of the abovementioned components are dissolved or dispersed in an organic solvent, and then the remaining components may be mixed into the composition thereof.

In the first step of the manufacturing method of the present invention, if the curable resin composition layer is configured with two layers including a first resin layer and a second resin layer, the following two methods may be used for example. Namely, the laminate of the present invention can be manufactured using (1) a method in which the second thermosetting resin composition is coated, sprayed, or flow casted onto the supporting body, and dried as desired to form the second resin layer, and next, the first thermosetting resin composition is further coated, sprayed, or flow casted onto the second resin layer, and dried as desired to thereby form the first resin layer, and (2) a method in which the second thermosetting resin composition is coated, sprayed, or flow casted onto the supporting body, and dried as desired to obtain a second resin layer having a supporting body, and the first thermosetting resin composition is coated, sprayed, or flow casted onto a separate supporting body, dried as desired to obtain a first resin layer having a supporting body, and the second resin layer having a supporting body and the first resin layer having a supporting body are laminated to thereby integrate these molded bodies, and the supporting body of the first resin layer side is detached, thereby producing a laminate. Of these manufacturing methods, the manufacturing method of (1) is preferable because it excels in productivity with a simpler process.

With the manufacturing method of the above-described method (1), when the second thermosetting resin composition is coated, sprayed, or flow casted onto the supporting body, and when the first thermosetting resin composition is coated, sprayed, or flow casted onto the second resin layer formed using the second thermosetting resin composition, or with the manufacturing method of the above-described method (2), when the second thermosetting resin composition and the first thermosetting resin composition are used to obtain a second resin layer having a supporting body and a first resin layer having a supporting body, preferably, the second thermosetting resin composition or the first thermosetting resin composition is added to an organic solvent as desired, and then coated, sprayed, or flow casted onto the supporting body.

With the manufacturing methods of (1) and (2) described above, the thicknesses of the second resin layer and the first resin layer are not particularly limited, but the thicknesses thereof are preferably such that the thickness of the second resin layer is preferably from 1 to 10 µm, more preferably from 1.5 to 8 µm, and even more preferably from 2 to 5 µm, and the thickness of the first resin layer is preferably from 4 to 45 µm, more preferably from 7 to 40 µm, and even more preferably from 9 to 29 µm. If the thickness of the second resin layer is too thin, when the second resin layer is used as the plating target layer, and a conductor layer is formed through electroless plating, there is a concern that the formability of the conductor layer could decrease. On the other hand, when the thickness of the second resin layer is too thick, there is a concern that the linear expansion of the cured resin layer will become too large. Furthermore, if the thickness of the first resin layer is too thin, wiring embedding performance could decrease in some cases.

Examples of methods used to apply the second thermosetting resin composition and the first thermosetting resin composition by coating include dip coating, roll coating, curtain coating, die coating, slit coating, gravure coating, and the like.

Moreover, the drying temperature is preferably set to a temperature at which the second thermosetting resin composition and the first thermosetting resin composition do not cure, and is ordinarily from 20 to 300° C., and preferably from 30 to 200° C. Additionally, the drying time is usually set to 30 seconds to 1 hour and is preferably set to 1 minute to 30 minutes.

(Second Step)

The second step of the manufacturing method of the present invention is a step of laminating the aforementioned curable resin composition layer with a supporting body obtained in step 1 onto a substrate on a curable resin composition layer forming surface side to thereby obtain a pre-curing composite with a supporting body formed from the substrate and the curable resin composition layer with a supporting body.

The substrate is not particularly limited, and examples include a substrate having a conductor layer on the surface, and the like. The substrate having a conductor layer on the surface is one having a conductor layer on the surface of an electrical insulating substrate, and examples of the electrical insulating substrate include substrates formed by curing a resin composition containing a known electrical insulating material (for example, alicyclic olefin polymers, epoxy compounds, maleimide resins, (meth)acrylic resins, diallyl phthalate resin, triazine resin, polyphenylene ether, glass, and the like), and the like. Moreover, the conductor layer is not particularly limited, but ordinarily is a layer containing wiring formed by a conductor such as an electrically conductive metal, and may further contain various types of circuits. The configuration, thickness, and the like of the wiring and circuits are not particularly limited. Specific examples of substrates having a conductor layer on the surface include printed wiring boards, silicon wafer boards, and the like. The thickness of the substrate having a conductor layer on the surface if ordinarily from 10 µm to 10 mm, preferably from 20 µm to 5 mm. and more preferably from 30 µm to 2 mm. Note that the height (thickness) of the wiring of the substrate having a conductor layer on the surface is ordinarily from 3 to 35 µm. Moreover, from the perspective of further improving the wiring embedding performance and insulation reliability when the cured resin layer is formed, the difference between the thickness of the curable resin composition layer and the height (thickness) of the wiring of the substrate having a conductor layer on the surface (thickness of curable resin composition layer–height (thickness) of the wiring) is preferably not more than 35 µm, and is more preferably from 3 to 30 µm.

Furthermore, the substrate which has a conductor layer on the surface and is used by the present invention is preferably subjected to a pretreatment of the conductor layer surface in order to improve adhesion with the curable resin composition layer. A known technique can be used without particular limitation as the method of pretreatment. For example, if the conductor layer is made of copper, examples of the method include oxidation treatment methods wherein a strong alkali oxidizing solution is brought into contact with the conductor layer surface to form a copper oxide layer on the conductor surface and then roughening is performed, methods of using sodium borohydride, formalin, and the like to perform reduction after oxidizing the conductor layer surface using the previous method, methods of precipitating a plating onto the conductor layer and then roughening, methods of bringing an organic acid into contact with the conductor layer to elute the grain boundary of the copper and then roughening, and methods of forming a primer layer onto the conductor layer by a thiol compound, silane compound, or the like. Of these, from the perspective of ease of maintaining the shape of the fine wiring pattern, the method of bringing an organic acid into contact with the conductor layer to elute the grain boundary of the copper and then roughening, and the method of forming a primer layer onto the conductor layer by a thiol compound, silane compound, or the like, are preferable.

In the second step of the manufacturing method of the present invention, examples of the method of laminating the curable resin composition with a supporting body onto the substrate on the curable resin composition layer forming surface side include methods of heat crimping the curable resin composition with a supporting body onto the substrate on the curable resin composition layer forming surface side, or the like.

Examples of the method of heat crimping include methods of overlaying the molded body or composite molded body with a supporting body so as to be in contact with the aforementioned conductor layer of the substrate, and performing heat crimping (lamination) using a pressurizer such as a pressurizing laminator, a press, a vacuum laminator, a vacuum press, a roll laminator, and the like. By applying heat and pressure, the conductor layer of the substrate surface and the molded body or composite molded body can be bonded so that a void is substantially not present at the interface therebetween. The molded body or composite molded body is usually laminated onto the conductor layer of the substrate in an uncured or semi-cured state.

The temperature of the heat crimping operation is usually from 30 to 250° C. and preferably from 70 to 200° C., the pressure to be applied is usually from 10 kPa to 20 MPa and preferably from 100 kPa to 10 MPa, and the time is usually from 30 seconds to 5 hours and preferably from 1 minute to 3 hours. Moreover, the heat crimping operation is preferably performed under reduced pressure in order to improve the embedding performance of the wiring pattern and suppress the occurrence of foaming. The pressure of the reduced pressure conditions when performing the heat crimping operation is ordinarily from 100 kPa to 1 Pa, and preferably from 40 kPa to 10 Pa.

(Third Step)

The third step of the manufacturing method of the present invention is a step of performing a first heating of the pre-curing composite body with a supporting body obtained in the second step and formed from the substrate and the curable resin composition layer with a supporting body, and thermally curing the curable resin composition layer to form a cured resin layer.

The heating temperature of the first heating in the third step may be appropriately set according to the curing temperature of the curable resin composition layer or the type of the supporting body that is used, but is preferably from 100 to 250° C., more preferably from 120 to 220° C., and even more preferably 150 to 210° C. Furthermore, the heating time of the first heating in the third step is usually from 0.1 to 3 hours and preferably from 0.25 to 1.5 hours. The method of heating is not particularly limited, and may be performed by using an electric oven or the like, for example. Furthermore, from the perspective of productivity, the thermal curing is preferably performed in air.

(Fourth Step)

The fourth step of the manufacturing method of the present invention is a step of performing hole punching from the supporting body side of the cured composite with a supporting body obtained in the above-described third step to form a via hole in the cured resin layer.

In the fourth step, the method for forming a via hole is not particularly limited, and the via hole can be formed by performing hole punching from the supporting body side through a physical process using drills, lasers, plasma etching, and the like. Of these methods, a method using a laser (carbon dioxide gas laser, excimer laser, UV-YAG laser, and the like), in other words, a method of irradiating a laser from the supporting body side to form a via hole is preferable because a finer via hole can be formed without impairing the characteristics of the cured resin layer. In the manufacturing method of the present invention, by forming a via hole in the cured resin layer by performing hole punching from the supporting body side, a via hole with a small diameter (the top diameter is preferably from 15 to 65 µm and more preferably from 15 to 55 µm, for example) can be formed with a high aperture ratio (bottom diameter/top diameter).

(Fifth Step)

The fifth step of the manufacturing method of the present invention is a step of peeling the supporting body from the cured composite with a supporting body to obtain a cured composite formed from the substrate and the cured resin layer. The method for peeling the supporting body is not particularly limited.

(Sixth Step)

The sixth step of the manufacturing method of the present invention is a step of subjecting the cured composite obtained after peeling away the supporting body to a second heating.

In the manufacturing method of the present invention, the curable resin composition layer is thermally cured with the supporting body attached to form a cured resin layer, after which a via hole is formed in the cured resin layer, and next the supporting body is peeled from the cured resin layer, after which the second heating is further performed to sufficiently advance the curing of the cured resin layer and appropriately remove volatile components contained in the cured resin layer (organic solvent or the like used for preparing the first thermosetting resin composition or the second thermosetting resin composition, for example) or the like, and thereby the heat resistance (solder heat resistance, for example) of the cured resin layer can be improved. In particular, when thermal curing is performed in a state where the supporting body remains attached without being peeled away, in some cases the volatile components or the like cannot be appropriately removed due to the influence of the supporting body (in particular, in some cases the volatile components or the like in the region in the vicinity of the supporting body cannot be removed), and due to the influence of these types of volatile components and the like, the obtained cured resin layer may have insufficient heat resistance in some cases. In contrast, with the manufacturing method of the present invention, while thermal curing (first heating) is performed in a state with the supporting body attached and not peeled away, after the supporting body is peeled away, heating is performed again by the second heating, and thereby the volatile components and the like that could not be removed due to the influence of the supporting body at the time of the first heating can be appropriately removed, and as a result, heat resistance (soldering heat resistance for example) can be sufficiently increased.

In the sixth step, the heating temperature of the second heating is not particularly limited, and from the perspective of improving adhesiveness between the cured resin layer after heating and the conductor layer formed on the cured resin layer, the heating temperature of the second heating is preferably set to a temperature which is lower than the heating temperature of the first heating in the above-described third step, is more preferably set to a temperature that is at least 10° C. lower than the heating temperature of the first heating, and is more preferably set to a temperature that is at least 30° C. lower than the heating temperature of the first heating. Furthermore, the heating temperature of the second heating may be set in relation to the boiling point of the organic solvent used for preparing the first thermosetting resin composition or the second thermosetting resin composition, and is preferably set to a temperature that is at least 5° C. higher than the boiling point of the organic solvent that is used, and more preferably is set to a temperature that is at least 10° C. higher than the boiling point of the organic solvent that is used. Specifically, the heating temperature of the second heating is preferably within a range of from 130 to 170° C., and more preferably within a range of from 140 to 160° C. By setting the heating temperature of the second heating to the abovementioned range, resin residue inside the via hole can be more appropriately removed in the below-described seventh step while improving the heat resistance of the obtained cured resin layer, and as a result, the conduction reliability of the via hole can be further improved.

Note that the heating time of the second heating in the sixth step is ordinarily from 0.1 to 3 hours, and is preferably from 0.25 to 1.5 hours. The heating method is not particularly limited, and for example, heating can be performed using an electric oven or the like. Furthermore, from the perspective of productivity, the thermal curing is preferably performed in air.

(Seventh Step)

The seventh step of the manufacturing method of the present invention is a step of removing the resin residue from inside the via hole of the cured composite after the second heating has been performed.

The method of removing the resin residue in the via hole is not particularly limited, and examples include methods of performing a desmear treatment or the like to the cured composite after peeling the supporting body. The method of the desmear treatment is not particularly limited, and examples include a method of bringing a solution of an oxidizing compound (desmear liquid) such as a permanganate or the like into contact with the cured composite thereof, for example. Specifically, the desmear treatment can be performed by performing a shaking immersion of the laminate body in which a via hole is formed for 1 to 50 minutes in an aqueous solution at 60 to 80° C. adjusted so as to have a sodium permanganate concentration of 60 g/L and a sodium hydroxide concentration of 28 g/L.

Note that with the manufacturing method of the present invention, a surface roughening treatment to roughen the surface of the cured resin layer may be performed before or after the desmear treatment for removing the resin residue in the via hole. The surface roughening treatment is performed in order to increase the adhesion between the cured resin layer and the conductor layer.

The surface roughening treatment is not particularly limited, and examples include methods which cause contact between the cured resin layer surface and an oxidizing compound; and the like. Examples of the oxidizing compound include known compounds having an oxidizing capability, such as inorganic oxidizing compounds and organic oxidizing compounds. The use of inorganic oxidizing compounds or organic oxidizing compounds is particularly preferable because of the ease of controlling the average surface roughness of the cured resin layer. Examples of the inorganic oxidizing compounds include permanganates, chromic anhydrides, dichromates, chromates, persulfates, activated manganese dioxide, osmium tetroxide, hydrogen peroxide, periodate salts, and the like. Examples of organic oxidizing compounds include dicumyl peroxide, octanoyl peroxide, m-chloroperbenzoic acid, peracetic acid, ozone, and the like.

Moreover, the manufacturing method of the present invention may be configured such that the surface roughening treatment of the cured resin layer is performed simultaneously with the above-described desmear treatment for removing resin residue inside the via hole.

(Eighth Step)

The eighth step of the manufacturing method of the present invention is a step of forming a conductor layer on the cured resin layer and on the inner wall surface of the via hole of the cured composite for which resin residue removal from inside the via hole was performed in the above-described seventh step.

In the eighth step of the manufacturing method of the present invention, the forming of the conductor layer on at least the inner wall surface of the via hole is performed by filling the via hole with a conductor by electroless plating or a combination of electroless plating and electrolytic plating, and through this, a conductor layer excelling in adhesion can be formed inside the via hole with high production efficiency.

Moreover, the method of forming the conductor layer on the cured resin layer is not particularly limited, but from the perspective of being able to form a conductor layer likewise excelling in adhesion, the forming is preferably performed by an electroless plating method or a combination of electroless plating and electrolytic plating.

When forming the conductor layer by the electroless plating method, first, before forming a metal thin film on the inner wall surface of the via hole and on a surface of the electrical insulating layer, a catalyst nucleus such as silver, palladium, zinc, cobalt or the like is generally attached onto the inner wall surface of the via hole and on the electrical insulating layer. The method of attaching the catalyst nucleus to the inner wall surface of the via hole and on the electrical insulating layer is not particularly limited, and examples include a method of immersing into a solution in which a metal compound such as silver, palladium, zinc, cobalt, or the like, or salts or complexes thereof, for example, is dissolved in an organic solvent such as water, alcohol, or chloroform at a concentration of 0.001 to 10 wt. % (may contain an acid, alkali, complexing agent, reducing agent, and the like as necessary) to reduce the metal; and the like.

The electroless plating solution used in the electroless plating method can be a known autocatalytic electroless plating solution, and the type of metal, type of reducing agent, type of complexing agent, hydrogen ion concentration, dissolved oxygen concentration, and the like that are contained in the plating solution are not particularly limited. For example, electroless copper plating solutions with a reducing agent of ammonium hypophosphite, hypophosphorous acid, ammonium borohydride, hydrazine, formalin, and the like; electroless nickel phosphorous plating solutions with a reducing agent of sodium hypophosphite; electroless nickel-boron plating solutions with a reducing agent of dimethylamine borane; electroless palladium plating solutions; electroless palladium-phosphorus plating solutions with a reducing agent of sodium hypophosphite; electroless gold plating solutions; electroless silver plating solutions; electroless nickel-cobalt-phosphorus plating solutions with a reducing agent of sodium hypophosphite; and other electroless plating solutions can be used.

After the metal thin film is formed, the substrate surface can be brought into contact with an antirust agent to perform an antirust treatment. Furthermore, after the metal thin film is formed, the metal thin film can be heated to improve adhesion performance and the like. The heating temperature is usually from 50 to 350° C., and preferably from 80 to 250° C. Note that the heating can be performed under pressurized conditions at this time. Examples of the pressurizing method at this time include methods which use physical pressurizing means such as hot press machines, pressurized heating rolls, and the like. The pressure that is applied is usually from 0.1 to 20 MPa, and is preferably from 0.5 to 10 MPa. High adhesion between the metal thin film and the electrical insulating layer can be secured within these ranges.

Furthermore, growing the plating by further performing electrolytic plating on the metal thin film that was formed by the electroless plating method in this manner is preferable. Thereby, the inside of the via hole can be filled with the conductor through electroless plating and electrolytic plating, and thick plating can be performed on the cured resin layer. When performing thick plating on the cured resin layer by electrolytic plating, preferably, a resist pattern for plating is formed on the metal thin film that was formed by the electroless plating method, electrolytic plating is further performed thereon to grow the plating, and then the resist is removed, and the metal thin film is further etched into a pattern by etching to form a conductor layer. The conductor layer formed by this method is usually formed from the patterned metal thin film and the plating grown thereon.

The laminate body thus obtained by the manufacturing method of the present invention is obtained by the aforementioned first step to eighth step, and therefore, a small diameter via hole with excellent heat resistance (solder heat resistance, for example) can be formed therein, and therefore, the laminate body can be favorably used as a multilayer circuit board by taking advantage of these characteristics.

Furthermore, by using the laminate body thus obtained by the manufacturing method of the present invention as a substrate used in the second step of the manufacturing method of the present invention, and by repeatedly performing the above-described third step to eighth step, further multilayering can be performed to thereby form a desired multilayer circuit board.

EXAMPLES

The present invention is described in further detail by the examples and comparative examples below. Note that "parts" and "%" in the examples are on a weight basis unless otherwise specified. Various physical properties were evaluated according to the methods below.
(1) Small Diameter Via Hole Formability After the via hole was formed, a desmear treatment and a second heating were performed on the cured composite, and then an electron microscope (magnification: 1000 times) was used to observe the via hole after the desmear treatment, and to measure the opening diameter of the via hole, and the small diameter via hole formability was evaluated according to the criteria below.
  A: Opening diameter of the via hole is less than 55 μm
  B: Opening diameter of the via hole is at least 55 μm, and not more than 65 μm
  C: Opening diameter of the via hole exceeds 65 μm
(2) Desmearing Performance After the via hole was formed, a desmear treatment and a second heating were performed on the cured composite, and then an electron microscope (magnification: 5000 times) was used to observe the via hole after the desmear treatment and to observe the resin residue (smear) in the via hole, and an evaluation was performed according to the criteria below.
  A: Area in which smear is present in the via hole is less than 3% of the measured area.
  B: Area in which smear is present in the via hole is 3% or more and less than 10% of the measured area.
  C: Area in which smear is present in the via hole is 10% or more of the measured area.
(3) Solder Heat Resistance The obtained multilayer printed wiring board was allowed to float on a solder bath at 260° C. for 60 seconds, after which the external appearance of the post-floating multilayer printed wiring board was observed and evaluated according to the criteria below.
(Evaluation Criteria)
  A: No swelling was observed.
  C: Swelling was observed at one or more locations.

Synthesis Example 1

As a first stage of polymerization, 35 molar parts of 5-ethylidene-bicyclo [2.2.1] hept-2-ene, 0.9 molar parts of 1-hexene, 340 molar parts of anisole, and 0.005 molar parts of ruthenium 4-acetoxybenzylidene (dichloro) (4,5-dibromo-1,3-dimesityl-4-imidazolin-2-ylidene) (tricyclohexylphosphine) (C1063, manufactured by Wako Pure Chemical Industries) as a ruthenium-based catalyst were added to a nitrogen substituted pressure resistant glass reactor, and a polymerization reaction was performed while stirring at 80° C. for 30 minutes to obtain a solution of a norbornene-based ring-opening polymer.

Next, as a second stage of polymerization, 45 molar parts of tetracyclo [6.5.0.12,5.08,13]trideca-3,8,10,12-tetraene, 20 molar parts of bicyclo [2.2.1] hept-2-ene-5,6-dicarboxylic anhydride, 250 molar parts of anisole, and 0.01 molar parts of C1063 were added to the solution obtained in the first stage of polymerization, and a polymerization reaction was performed by stirring at 80° C. for 1.5 hours to obtain a solution of a norbornene-based ring-opening polymer. When the solution was subjected to gas chromatography measurements, it was confirmed that no monomers were substantially remaining, and the polymerization conversion rate was 99% or higher.

Next, the solution of the obtained ring-opening polymer was inserted into a nitrogen substituted autoclave with a mixer, 0.03 molar parts of C1063 were added, and a hydrogenation reaction was performed by stirring at 150° C. at a hydrogen pressure of 7 MPa for 5 hours to obtain a solution of an alicyclic olefin polymer (1), which is a hydrogenation product of the norbornene-based ring-opening polymer. The weight average molecular weight of the alicyclic olefin polymer (1) was 60,000, the number average molecular weight was 30,000, and the molecular weight distribution was 2. Furthermore, the hydrogenation ratio was 95%, and the content rate of the repeating unit having a carboxylic anhydride group was 20 mol %. The solid content concentration of the solution of the alicyclic olefin polymer (1) was 22%.

Example 1

(Preparation of the First Thermosetting Resin Composition)

Fifty parts of a biphenyldimethylene skeleton novolac epoxy resin (trade name "NC-3000L", manufactured by Nippon Kayaku Co., Ltd., epoxy equivalent of 269) as the polyvalent epoxy compound (A) having a biphenyl structure, 50 parts of a tetrakis hydroxyphenylethane type epoxy compound (trade name "jER1031S", manufactured by Mitsubishi Chemical Corporation, epoxy equivalent of 200, softening point of 90° C.) as the epoxy group (B) containing a trivalent or higher polyvalent glycidyl group, 30 parts (15 parts in terms of the cresol novolac resin containing a triazine structure) of a cresol novolac resin containing a triazine structure as the phenol resin (C) containing a triazine structure (trade name "phenolite LA-3018-50P", propylene glycol monomethyl ether solution with a non-volatile content of 50%, manufactured by DIC Corporation, active hydroxyl group equivalent of 154), 115.3 parts (75 parts in terms of active ester compounds) of active ester compound as the active ester compound (D) (trade name "Epiclon HPC-8000-65T", toluene solution having a non-volatile content of 65%, manufactured by DIC Corporation, active ester group equivalent of 223), 350 parts of silica as a filler (trade name "SC2500-SXJ", manufactured by Admatechs), 1 part of a hindered phenol antioxidant as an anti-aging agent (trade name "Irganox (registered trademark) 3114", manufactured by BASF), and 110 parts of anisole (boiling point of 154° C.) were mixed and stirred with a planetary stirrer for 3 minutes. In addition, 8.3 parts (2.5 parts in terms of 1-benzyl-2-phenylimidazole) of a solution in which 1-benzyl-2-phenylimidazole was dissolved at 30% in anisole were mixed therein as the curing accelerator, and stirred for with a planetary stirrer for 5 minutes, and a varnish of the first thermosetting resin composition was obtained. Note that the amount of filler in the varnish was 64% in terms of solid content.

(Second Thermosetting Resin Composition)

Amounts of 454 parts of the solution of the alicyclic olefin polymer (1) obtained in Synthesis Example 1 (100 parts in terms of the alicyclic olefin polymer (1)), 36 parts of the polyvalent epoxy compound having a dicyclopentadiene skeleton as a curing agent (trade name "Epiclon HP7200L", manufactured by DIC Corporation, "Epiclon" is a registered trademark), 24.5 parts of silica as an inorganic filler (trade name "Admafine SO-C1", manufactured by Admatechs, average particle size of 0.25 µm, "Admafine" is a registered trademark), 1 part of tris (3,5-di-t-butyl-4-hydroxybenzyl)-isocyanurate as an anti-aging agent (trade name "Irganox (registered trademark) 3114", manufactured by BASF), 0.5 parts of 2-[2-hydroxy-3,5-bis (α,α-dimethylbenzyl) phenyl]-2H-benzotriazole as an ultraviolet absorber, and 0.5 parts of 1-benzyl-2-phenylimidazole as a curing accelerator were mixed with anisole, and by mixing so that the compounding agent concentration was 16%, a varnish of the second thermosetting resin composition was obtained.

(Preparation of the Cured Composite)

The varnish of the second thermosetting resin composition that was obtained above was applied onto a polyethylene terephthalate film (supporting body, thickness of 50 µm) having a mold release layer on a surface thereof using a wire bar, and was then dried at 80° C. in a nitrogen atmosphere for 5 minutes to obtain a film with a supporting body formed from an uncured second thermosetting resin composition, and on which a second resin layer (plated layer) with a thickness of 3 µm was formed.

Next, the varnish of the first thermosetting resin composition that was obtained above was applied onto the formed surface of the second resin layer formed from the second thermosetting resin composition of the film with a supporting body using a doctor blade (manufactured by Tester Sangyo Co., Ltd.) and an autofilm applicator (manufactured by Tester Sangyo Co., Ltd.), and then drying was performed in a nitrogen atmosphere at 80° C. for 5 minutes to obtain a curable resin composition layer with a supporting body, having the second resin layer and the first resin layer (adhesive layer) formed thereon with a total thickness of 30 µm. The curable resin composition layer with a supporting body was formed in the order of the supporting body, the second resin layer formed from the second thermosetting resin composition, and then the first resin layer formed from the first thermosetting resin composition.

Next, separately from the above, on a surface of a core material obtained by impregnating glass fibers with a varnish containing a glass filler and an epoxy compound not containing a halogen, a conductor layer with a wiring width and distance between wires of 50 µm and a thickness of 18 µm, and that was treated with microetching by bringing a surface thereof into contact with an organic acid, was formed onto a 160 mm square (length of 160 mm, width of 160 mm) double-sided copper clad substrate surface with a thickness of 0.8 mm and having copper with a thickness of 18 µm attached thereon, to obtain an inner layer substrate.

Pieces obtained by cutting the curable resin composition layer with a supporting body obtained above into 150 mm squares were affixed, with the supporting body attached, to both surfaces of the inner layer substrate such that the surface of the curable resin composition layer was on the inside, and then a vacuum laminator with a heat resistant rubber press plate on the top and bottom thereof was used, the pressure was reduced to 200 Pa, and heat crimping lamination was performed at a temperature of 110° C. and a pressure of 0.1 MPa for 60 seconds. Next, the obtained product was left to stand at room temperature for 30 minutes, after which a cured resin layer (electrical insulating layer) was formed by heating (the first heating) at 180° C. for 30 minutes and curing the curable resin composition layer.

Next, a carbon dioxide gas laser processor (product name "LUC-2K21", manufactured by Hitachi Via Mechanics, Ltd.) was used, and with the supporting body still attached, the cured resin layer formed on both surfaces of the inner substrate was irradiated with the carbon dioxide gas laser from the supporting body side with conditions that included 2 shots, a pulse width of 6 µs, and a frequency of 2000 Hz, and thereby a via hole with an opening diameter of 49 µm was formed in the cured resin layer. Then, the supporting body was peeled from the cured resin layer in which the via hole was formed.

(Second Heating Step)

Next, after the supporting body was peeled away, the cured composite was heated at 200° C. for 30 minutes (second heating).

(Desmear Treatment Step)

Next, after the second heating, the cured composite was subjected to shaking immersion for 15 minutes in a 60° C. aqueous solution which was prepared such that the concentration of a swelling liquid ("Swelling Dip SECURIGANT P", manufactured by Adtec Corporation, "SECURIGANT" is a registered trademark) was 500 mL/L and the concentration of the sodium hydroxide was 3 g/L, and then the cured composite was rinsed with water.

Next, shaking immersion was performed for 15 minutes in an 80° C. aqueous solution which was prepared such that the concentration of an aqueous solution of permanganate ("Concentrate Compact CP", manufactured by Adtec Corporation) was 640 mL/L and the sodium hydroxide concentration was 40 g/L, and then rinsing with water was performed.

Next, the cured composite was immersed for 5 minutes in a 4° C. aqueous solution which was prepared such that a hydroxylamine sulfate aqueous solution ("Reduction SECURIGANT P500", manufactured by Adtec Corporation, "SECURIGANT" is a registered trademark) concentration was 100 mL/L and a sulfuric acid concentration was 35 mL/L, a neutralization reduction treatment was performed, and then rinsing with water was performed. Furthermore, the small diameter via hole formability and desmearing performance of the cured composited obtained in this manner were evaluated after the desmearing treatment and second heating in accordance with the abovementioned methods. The results are shown in Table 1.

(Cleaner/Conditioner Step)

Next, the cured composite after the desmearing treatment was immersed for 5 minutes in a 50° C. aqueous solution which was prepared such that a cleaner/conditioner aqueous solution ("Alcup MCC-6-A", manufactured by Uyemura & Co., Ltd., "Alcup" is a registered trademark) had a concentration of 50 mL/L, and then a cleaner/conditioner treatment was performed. Next, the cured composite was immersed for 1 minute in an aqueous solution at 40° C., and then rinsed with water.

(Soft Etching Treatment Step)

Next, the cured composite was immersed for 2 minutes in an aqueous solution which was prepared such that a sulfuric acid concentration was 100 g/L and a sodium persulfate concentration was 100 g/L, a soft etching treatment was performed, and then the cured composite was rinsed with water.

(Acid Pickling Treatment Step)

Next, the cured composite was immersed for 1 minute in an aqueous solution which was prepared such that a sulfuric acid concentration was 100 g/L, acid pickling was performed, and then the cured composite was rinsed with water.

(Catalyst Provision Step)

Next, the cured composite was immersed for 5 minutes in a 60° C. plating catalyst aqueous solution containing Pd salt which was prepared such that the concentration of an Alcup activator MAT-1-A (trade name, manufactured by Uyemura & Co., Ltd., "Alcup" is a registered trademark) was 200 mL/L, the concentration of an Alcup activator MAT-1-B (trade name, manufactured by Uyemura & Co., Ltd., "Alcup" is a registered trademark) was 30 mL/L, and the sodium hydroxide concentration was 0.35 g/L, and then the cured composite was rinsed with water.

(Activation Step)

Next, the cured composite was immersed at 35° C. for 3 minutes in an aqueous solution which was prepared such that an Alcup reducer MAB-4-A (trade name, manufactured by Uyemura & Co., Ltd., "Alcup" is a registered trademark) was 20 mL/L and an Alcup reducer MAB-4-B (trade name, manufactured by Uyemura & Co., Ltd., "Alcup" is a registered trademark) was 200 mL/L, a reducing treatment was performed on the plating catalyst, and then the cured composite was rinsed with water.

(Accelerator Processing Step)

Next, the cured composite was immersed for 1 minute at 25° C. in an aqueous solution prepared such that an Alcup accelerator MEL-3-A (trade name, manufactured by Uyemura & Co., Ltd., "Alcup" is a registered trademark) was 50 mL/L.

(Electroless Plating Step)

The cured composite obtained in this manner was immersed at a temperature of 36° C. for 20 minutes in an electroless copper plating solution while blowing air therein, the plating solution thereof being prepared such that the concentration of Thru-cup PEA-6-A (trade name, manufactured by Uyemura & Co., Ltd., "Thru-cup" is a registered trademark) was 100 mL/L, the concentration of Thru-cup PEA-6-B-2X (trade name, manufactured by Uyemura & Co., Ltd.) was 50 mL/L, the concentration of Thru-cup PEA-6-C (trade name, manufactured by Uyemura & Co., Ltd.,) was 14 mL/L, the concentration of Thru-cup PEA-6-D (trade name, manufactured by Uyemura & Co., Ltd.) was 15 mL/L, the concentration of Thru-cup PEA-6-E (trade name, manufactured by Uyemura & Co., Ltd.) was 50 mL/L, and the concentration of a 37% formalin aqueous solution was 5 mL/L, and an electroless copper plating treatment was performed to form a metal thin film on the via hole inner wall surface of the cured composite and on the cured resin layer surface (surface of the second resin layer after curing, formed from the second thermosetting resin composition).

Next, the cured composite on which the metal thin film was formed was immersed for 1 minute at room temperature in an antirust solution that was prepared such that a concentration of AT-21 (trade name, manufactured by Uyemura & Co., Ltd.) was 10 mL/L, and the cured composite was rinsed with water. The cured composite was then dried to prepare an antirust treated cured composite. The cured composite that was subjected to the antirust treatment was subjected to an annealing treatment at 150° C. for 30 minutes in an air atmosphere.

The cured composite that was subjected to an annealing treatment was subjected to electrolytic copper plating to form an electrolytic copper plating film with a thickness of 30 μm. Next, by performing a heat treatment at 180° C. for 60 minutes on the cured composite, the via hole of the cured composite was filled with the conductor formed from the metal thin film layer and the electrolytic copper plating, and a double-sided two-layer multilayer printed wiring board, formed with a conductor layer formed from the metal thin film layer and the electrolytic copper plating film on the cured resin layer (electrical insulating layer) of the cured composite, was obtained. Furthermore, the obtained multilayer printed wiring board was used to evaluate the solder heat resistance. The results are shown in Table 1.

Example 2

A cured composite and a multilayer printed wiring board were obtained in the same manner as Example 1 with the exception that the heating temperature in the second heating step was changed from 200° C. to 160° C., and evaluations were performed in the same manner. The results are shown in Table 1.

Comparative Example 1

A cured composite and a multilayer printed wiring board were obtained in the same manner as Example 1 with the exception that heating by the second heating step was not performed, and evaluations were performed in the same manner. The results are shown in Table 1.

Comparative Example 2

A cured composite body and a multilayer printed circuit board were obtained in a manner similar to Example 1 and similarly evaluated, with the exception that a curable resin composition layer with a supporting body was affixed to both surfaces of an inner layer substrate, the supporting body was peeled off, the first heating and via hole formation were performed in a condition where the supporting body was peeled off, and the heating temperature in the second heating step was changed from 200° C. to 160° C. The results are shown in Table 1.

TABLE 1

|  | Example 1 | Example 2 | Comparative Example 1 | Comparative Example 2 |
| --- | --- | --- | --- | --- |
| Manufacturing Conditions | | | | |
| First heating temperature (° C.) | 180 | 180 | 180 | 180 |
| Via hole formation | Formation with the supporting body | Formation with the supporting body | Formation with the supporting body | Formation after peeling away the supporting body |
| Second heating temperature (° C.) | 200 | 160 | No second heating | 160 |
| Evaluation | | | | |
| Small diameter via hole formability | A | A | A | C |
| Desmearing Performance | B | A | A | A |
| Solder heat resistance | A | A | C | A |

As shown in Table 1, according to the manufacturing method of the present invention, a small diameter via hole can be formed, and a laminate body with excellent solder heat resistance can be obtained (Examples 1, 2).

However, if a second heating (heating after via hole formation and peeling away of the supporting body) is not performed, the results show that the soldering heat resistance is inferior (Comparative Example 1).

Furthermore, when the first heating and via hole formation were performed in a state with the supporting body peeled off, a small radius via hole could not be formed (Comparative Example 2).

What is claimed is:

1. A method for manufacturing a laminate body, the method thereof comprising:
   a first operation of forming, onto a supporting body, a curable resin composition layer comprising a thermosetting resin composition to obtain a curable resin composition layer with a supporting body;
   a second operation of laminating the curable resin composition layer with the supporting body onto a substrate to obtain a pre-curing composite, comprising the substrate laminated to the curable resin composition layer with a supporting body;
   a third operation of performing a first heating of the pre-curing composite, and thermally curing the curable resin composition layer to form a cured resin layer to thereby obtain a cured composite;
   a fourth operation of performing hole punching from the supporting body side of the cured composite to thereby form a via hole in the cured resin layer;
   a fifth operation of peeling away the supporting body from the cured composite;
   a sixth operation of performing a second heating of the cured composite;
   a seventh operation of removing resin residue from inside the via hole of the cured composite; and
   an eighth operation of forming a conductor layer on an inner wall surface of the via hole of the cured composite and on the cured resin layer;
   and in the eighth operation, forming a conductor layer in the via hole by filling the inside of the via hole with a conductor by electroless plating or a combination of electroless plating and electrolytic plating.

2. The method for manufacturing a laminate body according to claim 1, wherein the heating temperature of the second heating in the sixth operation is lower than the heating temperature of the first heating in the third operation.

3. The method for manufacturing a laminate body according to claim 1, wherein the forming the conductor layer on the inner wall surface is performed by electroless plating or a combination of electroless plating and electrolytic plating.

4. A method for manufacturing a multilayer circuit board, comprising:
   forming on a supporting body a curable resin composition layer comprising a thermosetting resin composition;
   laminating the curable resin composition layer onto a substrate, together with the supporting body, to obtain a pre-curing composite;
   performing a first heating of the pre-curing composite, thereby thermally curing the curable resin composition layer to form a cured resin layer and thereby obtain a cured composite;
   performing hole punching from the supporting body side of the cured composite to thereby form a via hole in the cured resin layer;
   peeling away the supporting body from the cured composite;
   performing a second heating of the cured composite;
   removing resin residue from inside the via hole of the cured composite;
   forming a conductor layer on an inner wall surface of the via hole;

and forming a conductor layer in the via hole by filling the inside of the via hole with a conductor by electroless plating or a combination of electroless plating and electrolytic plating.

5. The method of claim 4, further comprising providing a mold release layer over the supporting body prior to forming the curable resin composition layer.

6. The method of claim 4, further comprising performing a mold release treatment on the supporting body prior to forming the curable resin composition layer.

7. The method of claim 4, wherein the thermosetting resin composition comprises a novolac epoxy compound having a biphenyl structure, or a condensed polycyclic structure, or a combination of a biphenyl structure and a condensed polycyclic structure.

8. The method of claim 4, wherein the curable resin composition layer comprises a first layer of a first resin composition and a second resin layer of a second composition different from the first composition.

9. The method of claim 4, further comprising drying the curable resin composition layer at 30° C. to 200° C.

10. The method of claim 4, wherein laminating comprises heat crimping at reduced pressure conditions of from 40 kPa to 10 MPa.

11. The method of claim 10, wherein the applied pressure is from 100 kPa to 10 MPa.

12. The method of claim 4, wherein hole punching comprises irradiating a laser from the supporting body side.

13. The method of claim 4, further comprising surface roughening treatment prior to forming the conductor layer on an inner wall surface of the via hole.

14. The method of claim 4, further comprising forming a catalyst nucleus onto the inner wall surface prior to forming the conductor layer on the inner wall surface of the via hole.

* * * * *